Figure 1:
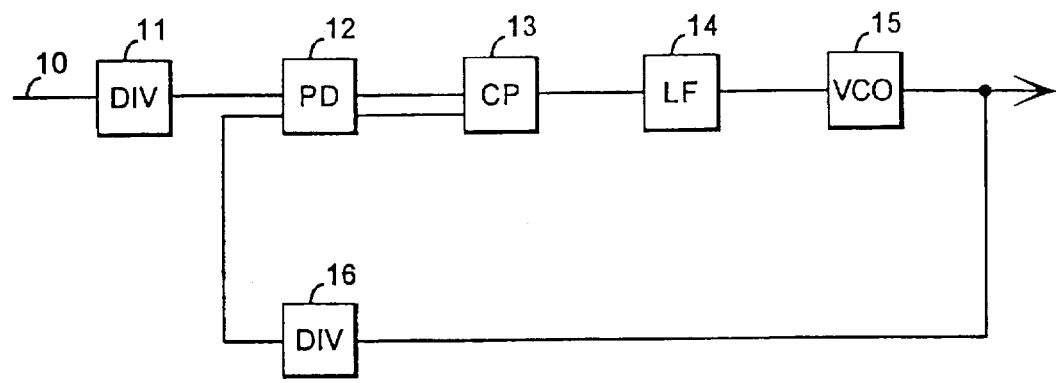

United States Patent [19]
Haapanen et al.

[11] Patent Number: 5,751,194
[45] Date of Patent: May 12, 1998

[54] PHASE-LOCKED LOOP HAVING CHARGE PUMP CONTROLLED ACCORDING TO TEMPERATURE AND FREQUENCY

[75] Inventors: Mika Haapanen; André Dekker, both of Oulu, Finland

[73] Assignee: Nokia Telecommunications OY, Espoo, Finland

[21] Appl. No.: 750,593

[22] PCT Filed: Jun. 5, 1995

[86] PCT No.: PCT/FI95/00320

§ 371 Date: Dec. 6, 1996

§ 102(e) Date: Dec. 6, 1996

[87] PCT Pub. No.: WO95/34133

PCT Pub. Date: Dec. 14, 1995

[30] Foreign Application Priority Data

Jun. 7, 1994 [FI] Finland ............ 942680

[51] Int. Cl.⁶ ............ H03L 1/02; H03L 7/085; H03L 7/18
[52] U.S. Cl. ............ 331/17; 331/176
[58] Field of Search ............ 331/17, 176

[56] References Cited

U.S. PATENT DOCUMENTS

| | | | |
|---|---|---|---|
| 4,389,621 | 6/1983 | Futatsuishi | 331/1 A |
| 4,871,979 | 10/1989 | Shearer et al. | 330/253 |
| 5,173,665 | 12/1992 | Norimatsu | 331/25 |
| 5,477,194 | 12/1995 | Nagakura | 331/10 |

FOREIGN PATENT DOCUMENTS

| | | |
|---|---|---|
| 0 310 863 | 4/1989 | European Pat. Off. |
| 0 412 491 | 2/1991 | European Pat. Off. |
| 0 598 258 | 5/1994 | European Pat. Off. |
| 0 599 372 | 6/1994 | European Pat. Off. |
| WO 93/15555 | 8/1993 | WIPO |

OTHER PUBLICATIONS

Van Paemel, Mark, Analysis of a Charge–Pump PLL; A New Model, *IEEE Transactions On Communications*, vol. 42, No. 7, Jul. 1994. pp. 2490–2498.

Gardner, Floyd M., "Charge–Pump Phase–Lock Loops", *IEE Transactions On Communications*, vol. com-28, No. 11, Nov. 1980. pp. 1849–1858.

*Primary Examiner*—Siegfried H. Grimm
*Attorney, Agent, or Firm*—IP Group of Pillsbury Madison & Sutro LLP

[57] ABSTRACT

A phase locked loop (PLL) includes a phase comparator (12), a charge pump (13), a loop filter (14) and a voltage controlled oscillator (15). In order to minimize the lock-in time of the PLL under conditions of varying external temperatures, the PLL is supplied with temperature measurements, and the output of the charge pump is controlled according to both the external temperature and a desired frequency.

7 Claims, 2 Drawing Sheets

PHASE-LOCKED LOOP HAVING CHARGE PUMP CONTROLLED ACCORDING TO TEMPERATURE AND FREQUENCY

This application is a national phase of international application PCT/FI95/00320, filed Jun. 5, 1995.

The present invention relates to a method for controlling a phase-locked loop, which loop comprises a phase comparator, a charge pump, a loop filter and a voltage-controlled oscillator, and in which method the loop is provided with information on the measurement result of external temperature.

The operation of phase-locked loops is sensitive to variations in external temperatures, as is usually the case with electronic components and devices. Phase-locked loops are used, for example, in base stations and subscriber telecommunication terminals whose operation conditions vary greatly.

Phase-locked loops are designed and their adjustment is carried out, if possible, in such a way that when a loop moves from one frequency to another, the lock-in time of the loop onto the new frequency would be as short as possible. Best results are obtained, if loop adjustment is critically attenuated. In such a case, frequency error decreases fastest and the lock-in time is minimized. In phase-locked loops, variations in temperature cause the dynamic response of the loop to change. In cases the dynamic response changes due to variations in temperature, the adjustment either becomes supercritical or subcritical which results in an increase in the lock-in time.

The aforementioned phenomenon is especially problematic in systems which utilize frequency hopping, such as a cellular radio network, in which the frequency used changes time-slot-specifically. In the prior art solutions, it is well known to implement frequency hopping as a so-called baseband hopping in which a frequency synthesizer remains on a fixed frequency and does not change frequency time-slot-specifically. In cases frequency hopping synthesizers are used, the aim is to stabilize the lock-in time by an analog coupling in which the amplification of the operational amplifier of the loop filter is temperature controlled.

The drawback of baseband frequency hopping is that its implementation in a base station of a cellular radio network requires complete units and several transceivers in the base station. The number of hopping frequencies, however, is restricted to the number of transceivers. It is not possible to apply said method in a subscriber telecommunication terminal.

The dynamic response of a phase-locked loop is determined by a phase comparator, a loop filter and a voltage-controlled oscillator all of which are temperature dependent components. Furthermore, temperature dependent behaviour varies from one frequency of the voltage-controlled oscillator to another. For this reason, it is very difficult to perform temperature dependent amplification adjustment of a loop filter by an analog coupling, and to perform adjustment by both temperature and frequency is virtually impossible.

It is thus an aim of the present invention to implement an adjustment of a phase-locked loop, which adjustment stays critically attenuated in the required temperature range. Thus, by a method in accordance with the invention it is possible to minimize the lock-in time when moving from one frequency to another regardless of variations in temperature.

This is obtained by a method described in the introductory section, characterized in that the output signal of the charge pump is controlled on the basis of external temperature and the frequency being monitored.

The invention further relates to a phase-locked loop which comprises a phase comparator, a charge pump, a loop filter and a voltage-controlled oscillator, and which loop has measurement information on external temperature as an input. It is characteristic of a phase-locked loop of the invention that the loop comprises a means for controlling the output signal of the charge pump on the basis of the external temperature and the frequency being monitored.

The method of the invention enables temperature compensation of a frequency hopping synthesizer without external components. The method of the invention and the phase-locked loop can be used both in a base station and in a subscriber telecommunication terminal. In the base station equipment, the information on temperature required for the adjustment of the phase-locked loop is already readily available.

Figure 2A:
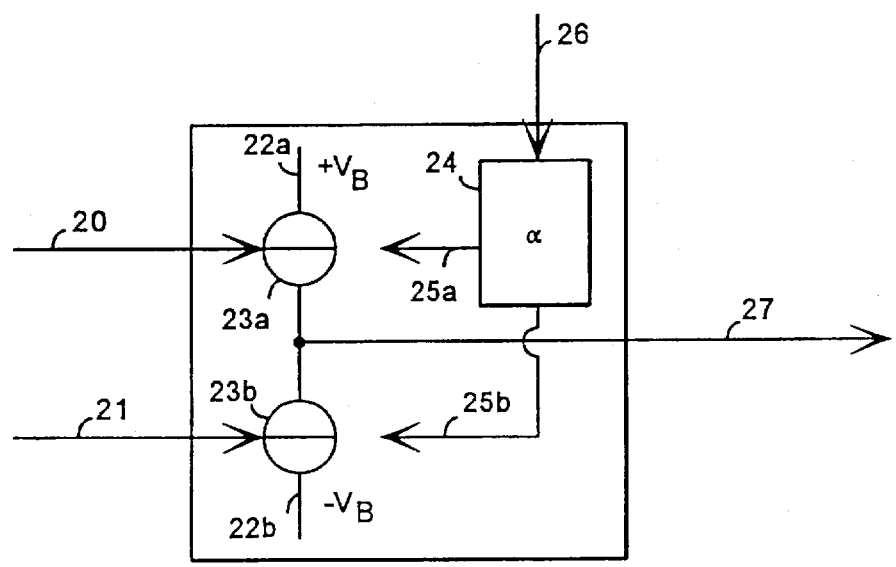
Figure 2B:
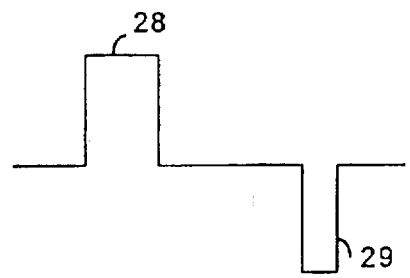
Figure 3:
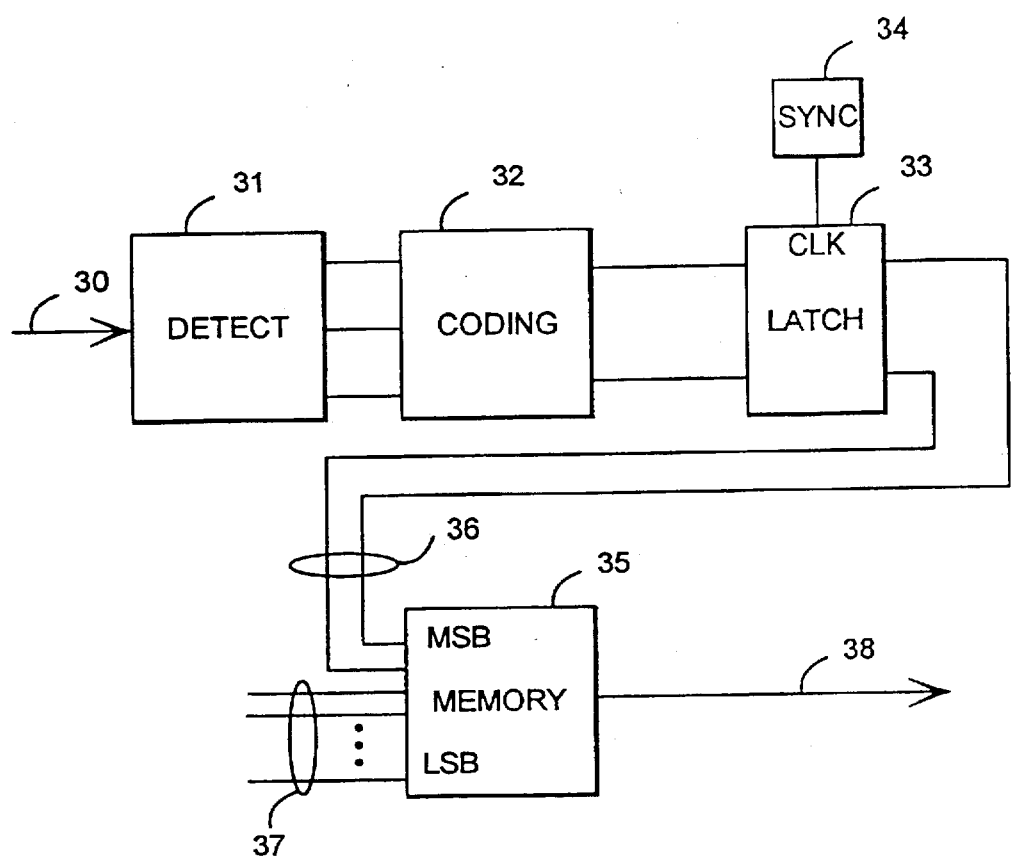

In the following, the invention will be described in greater detail with reference to the examples of the accompanying drawings in which FIG. 1 shows a block diagram illustration of the structure of the phase-locked loop in accordance with the invention, FIG. 2a shows a block diagram illustration of a charge pump used in a phase-locked loop of the invention, FIG. 2b illustrates an output signal of a charge pump, and FIG. 3 illustrates by means of a block diagram an implementation example of a control block of a charge pump used in a phase-locked loop of the invention.

FIG. 1, then, illustrates the structure of a phase-locked loop. The phase-locked loop is applied a reference frequency 10 as an input, which reference frequency is fed through a reference divider 11 to a phase comparator 12 to which a signal from a main divider 16 is applied as a second input. The phase comparator compares the phase of the two input signals and, proportionally to the phase difference, controls a charge pump 13 by the two signals. The charge pump 13 generates a signal proportional to the phase difference and frequency, which signal is filtered by a low pass filter 14 and applied as control to a voltage-controlled oscillator 15. The oscillator output signal is fed back to the phase comparator 12 through the main divider 16. The method of the invention requires that a software controlled power source, such as the circuits Philips UMA1005T, SA7025 or SA8025, and Motorola MC145200 and MC145201, is used in the phase-locked loop.

FIG. 2a illustrates a charge pump of a phase-locked loop in greater detail. The charge pump comprises two power sources 23a and 23b to which signals 20 and 21 from the phase comparator 12, and operating voltages 22a and 22b are applied as inputs. In a phase-locked loop of the invention, the charge pump also comprises a means 24 which controls the power sources 23a, 23b by signals 25a, 25b on the basis of a control signal 26. The control signal 26 can thus provide information on the external temperature. As an output of the charge pump, a pulse shape signal 27 illustrated in FIG. 2b is provided, said pulse shape signal 27 being proportional to the output signal of the phase comparator.

The output signal of the charge pump contains either negative or positive pulses whose frequency and width are proportional to the output signal of the phase comparator. FIG. 2b shows two pulses 28, 29 of which the first pulse 28 is positive and the second pulse 29 negative. Low pass filtered in the filter 14, the pulses control the output frequency of the oscillator 15 to the right direction. In a method of the invention, the amplitude of the output signal of the charge pump is controlled on the basis of information on external temperature. Thus, the phase-locked loop can adapt to variations in temperature. Temperature variations, then, influence the height of the output signals of the charge pump, and the output signal of the phase comparator influences the width and frequency of the pulses.

The response of an open loop of a phase-locked loop can, for example, be of the following kind:

$$G(s;T) = \alpha * K_D(T) * \frac{1}{s\tau_1(T)} * \frac{1+s\tau_2(T)}{s\tau_3(T)} * \frac{K_v(T)}{s}$$

in which
- α=control factor
- $K_D$=output current/phase difference
- T=temperature
- s=jω, complex frequency
- $t_1=t_2=t_3$=time constants of the loop filter
- $K_v$=frequency change/control voltage change of the oscillator The control factor a in the form represents a correction factor for the influence of temperature. The variable s is frequency dependent, i.e. s=j2*π*f, in which f represents frequency.

In a preferred embodiment of a phase-locked loop of the invention, the control factor is implemented by software. The charge pump can be controlled by software so that the control information required by the charge pump for each frequency and different temperatures is experimentally sought beforehand and stored in a memory circuit, for example, in a flash memory. The control information of the charge pump corresponding to different temperatures can either be stored in the same memory circuit as the data that determines frequency, or in a separate memory circuit reserved for temperature compensation.

FIG. 3 illustrates by means of a block diagram a preferred embodiment of a control block of a charge pump used in a phase-locked loop of the invention. The control can be implemented in several other ways, too. However, in the described method a simple structure is obtained. Typically, it is enough in temperature control that in a desired temperature range (for example, −10° C.−+60° C.), the temperature is included in a certain temperature segment which can be set to suit the purpose, for example <0° C., 0° C.−20° C., 20° C.−40° C. and >40° C. Control to the charge pump is transmitted depending on the segment to which the measured value of temperature at a given time belongs.

Information 30 on external temperature is applied to the control block as an input, for example, as a temperature dependent voltage which typically lies in the 0 . . . 5 V area. The control block comprises a means 31 which interprets the temperature message and detects which temperature range is in question. The control block further comprises a coding means 32 which codes the information on the temperature range as an address of the memory circuit 35. An advantageous embodiment of the control block further comprises means 33 and 34 which prevent the temperature control from altering in cases the memory circuit output controls the charge pump. By way of synchronization, address information changes can be performed at a suitable time, i.e. when the memory circuit is not being read.

Address information 36 from the coding means is thus applied as an input to memory circuit 35 as the most significant bits. As the second input to the memory circuit, the address information 37 is applied, which chooses the output data as a function of frequency. In the example of the figure, the charge pump control information corresponding to different temperatures is thus stored in the same memory circuit as the frequency determining data. The output 35 of the memory circuit, then, provides a control signal 38 for the charge pump, which signal is thus dependent on both the frequency information and the external temperature.

The memory circuit 35 is divided in the example of FIG. 3 into four temperature blocks on the basis of two most significant address buses. The blocks are identical as far as their division number data is concerned, but each channel (frequency) can have a separate charge pump data.

Although the invention is described above with reference to the example of the attached drawings, it is obvious that the invention is not restricted to that, but it may be varied in various ways within the inventive idea of the attached claims. Temperature compensation, for example, can be performed as a combination of analog and software adjustment in which case the analog compensation could function as a fine adjustment for the software performed rough adjustment.

We claim:

1. A method for controlling a phase-locked loop, which loop comprises a phase comparator (12), a charge pump (13), a loop filter (14) and a voltage-controlled oscillator (15), and in which method the loop is provided with information on the measurement result of external temperature, characterized in that the output signal of the charge pump (13) is controlled according to the external temperature and a desired frequency.

2. A method as claimed in claim 1, characterized in that the amplitude of the current output of the charge pump (13) is controlled on the basis of information on external temperature.

3. A method as claimed in claim 1, characterized in that in the phase-locked loop, control information of the charge pump (13) corresponding to different temperatures is stored in a memory circuit (35), and that the measurement result of the temperature applied as an input to the loop is coded as the memory circuit address on the basis of which the charge pump is provided with the desired control.

4. A method as claimed in claim 1, characterized in that the desired temperature range is divided into several temperature segments, and the temperature control of the charge pump (13) depends on the segment to which the external temperature belongs.

5. A phase-locked loop which comprises a phase comparator (12), a charge pump (13), a loop filter (14) and a voltage-controlled oscillator (15), and which loop has measurement information on external temperature as an input, characterized in that the loop comprises a means (24) for controlling the output signal of the charge pump on the basis of the external temperature and a desired frequency.

6. A phase-locked loop as claimed in claim 5, characterized in that the means (24) for controlling the output signal of the charge pump comprises a means (31) for processing the temperature measurement result, a means (32) for coding the temperature information as a memory circuit address, and a memory circuit (35) in which the charge pump control information corresponding to different temperatures is stored.

7. A phase-locked loop as claimed in claim 6, characterized in that the means (24) for controlling the output signal of the charge pump comprises means (33, 34) which prevent the address of memory circuit (35) from altering in cases the memory circuit output controls the charge pump (13).

* * * * *